United States Patent [19]
O'Neill et al.

[11] Patent Number: 5,401,543
[45] Date of Patent: Mar. 28, 1995

[54] METHOD FOR FORMING MACROPARTICLE-FREE DLC FILMS BY CATHODIC ARC DISCHARGE

[75] Inventors: David G. O'Neill, Woodbury; Jonathan G. Storer, Mendota Heights, both of Minn.

[73] Assignee: Minnesota Mining and Manufacturing Company, St. Paul, Minn.

[21] Appl. No.: 149,292

[22] Filed: Nov. 9, 1993

[51] Int. Cl.⁶ .............................................. B05D 3/06
[52] U.S. Cl. .................................. 427/580; 427/122; 204/298.41; 204/192.38
[58] Field of Search ............................. 427/580, 122; 204/298.41, 192.38

[56] References Cited

U.S. PATENT DOCUMENTS

| | | | |
|---|---|---|---|
| 3,836,451 | 9/1974 | Snaper | 204/298 |
| 4,452,686 | 6/1984 | Axenov et al. | 204/298 |
| 5,087,959 | 2/1992 | Omori et al. | 357/54 |
| 5,098,737 | 3/1992 | Collins et al. | 427/53 |
| 5,254,237 | 10/1993 | Snaper et al. | 204/298.41 |
| 5,281,321 | 1/1994 | Stürmer et al. | 204/298.41 |

FOREIGN PATENT DOCUMENTS

3712205A1 10/1988 Germany .

OTHER PUBLICATIONS

Coll et al., "Diamond–like carbon films synthesized by cathodic are evaporation", *Thin Solid Films*, 209 (Mar. 1992), pp. 165–173.

S. Anders and I. Brown, "Macroparticle-free Thin Films Produced By An Efficient Vacuum Arc Deposition Technique", *J. Appl. Phys.*, 74 (6), Sep. 15, 1993) pp. 4239–4241.

C. Charrier, P. Jacquot and E. Denisse, "Carbon Films Deposited By The Physical Vapour Deposition Focused-Arc Evaporation Technique", *Diamond and Related Materials*, 3 (1993) pp. 41–46.

I. I. Aksenov, S. I. Vakula, V. G. Padalka, V. E. Strel'nitskii, and V. M. Khoroshikh, "High-Efficiency Source of Pure Carbon Plasma", *Sov. Phys. Tech. Phys.*, 25(9), Sep. 1980, pp. 1164–1166.

I. I. Aksenov, V. A. Belous, V. G. Padalka and V. M. Khoroshikh, "Transport of Plasma Streams In A curvilinear Plasma-Optics System", *Sov. J. Plasma Phys.*, 4(4), Jul.-Aug. 1978, pp. 425–428.

R. L. Boxman and S. Goldsmith, "The Interatino Between Plasma and Macropoarticles In A Multicathode-Spote Vacuum Arc", *J. Appl. Phys.*, 52(1), Jan. 1981, pp. 151–161.

Z. Marinkovic and R. Roy, "Preparation and Properties of Sputtered 'Glassy' Carbon Films", *Carbon*, vol. 14 (1976), pp. 329–331.

D. M. Sanders, D. B. Boercker and S. Falabella, "Coating Technology Based on the Vacuum Arc—A Review", *IEEE Transactions on Plasma Science*, vol. 18, No. 6, Dec. 1890, pp. 883–894.

A. Richter, I. Muhling and M. Klose, "Properties of Laser Plasma Deposited Carbon Films", *J. Non-Cryst. Solids*, 107 (1988) pp. 128–131.

*Primary Examiner*—Roy V. King
*Attorney, Agent, or Firm*—Gary L. Griswold; Walter N. Kirn; Carole Truesdale

[57] ABSTRACT

The present invention provides a method for producing a diamond-like carbon coating. The method comprises the steps of providing a substrate to be coated, providing a cathode of vitreous carbon or a pyrolytic graphite cathode and initiating a cathodic arc discharge with the arc spot on the cathode surface and directing the resulting carbon plasma toward the substrate to form a coating on said substrate, said coating being substantially macroparticle free.

13 Claims, 3 Drawing Sheets

METHOD FOR FORMING MACROPARTICLE-FREE DLC FILMS BY CATHODIC ARC DISCHARGE

FIELD OF THE INVENTION

The present invention relates to a method for producing diamond-like coatings and the coated articles made thereby.

BACKGROUND OF THE INVENTION

Amorphous carbon films having diamond-like properties of extreme hardness, extremely low electrical conductivity, low coefficients of friction, and optical transparency over a wide range of wavelengths, have widespread applications as optical coatings, low friction, anti-corrosion coatings and wear-resistant coatings and in various other applications such as surface finishing and in semiconductor manufacturing.

Diamond-like carbon is a non-crystalline, or amorphous, material having two types of carbon-carbon bonds, i.e., hexagonal graphite bonds ($sp^2$) and tetrahedral diamond bonds ($sp^3$). Thus, diamond-like carbon has both limited long range order and two types of short range order.

Diamond-like carbon may be hydrogenated or non-hydrogenated. Hydrogenated diamond-like carbon is produced from a hydrocarbon gas mixture using various energy sources, e.g., DC discharge, microwave and RF energy, oxyacetylene torches, and hot filaments. Non-hydrogenated diamond-like coatings can be produced using magnetron sputtering, electron beam evaporation, laser ablation and mass filtered carbon-ion beam deposition techniques, each of which has a very low deposition rate. Each method for producing the non-hydrogenated diamond-like carbon produces a hard carbon coating but the coatings have differing $sp^3/sp^2$ bond ratios and, thus, the structural and physical characteristics differ.

The $sp^3/sp^2$ bond ratio can be estimated from the plasmon energy determined by electron energy loss spectroscopy. The plasmon energy is proportional to the atom density and diamond has a greater atom density and plasmon energy than graphite. Polycrystalline graphite has a plasmon energy loss of about 25 electron volts (eV). Diamond has a plasmon energy loss of about 33 eV. Non-hydrogenated diamond-like carbon has a plasmon energy loss between about 26 and 32 eV, the higher plasmon energies corresponding to higher atom densities which are believed to be due to an increased $sp^3$ bonding component.

Hydrogen-free non-crystalline diamond-like carbon coatings can also be produced using cathodic arc plasma deposition, a process which provides high deposition rates and allows control over the incident ion kinetic energy and the substrate temperatures. The $sp^3/sp^2$ bond ratio is believed to be dependent on the incident ion kinetic energy. Cathodic arc plasma deposition can produce diamond-like carbon coatings with higher plasmon energies than alternative processes, thus, yielding higher $sp^3/sp^2$ bond ratios.

A cathodic arc discharge occurs when a high current power source is connected between two sufficiently conductive electrodes and the electrodes are momentarily in contact, either physically or by another discharge. Arc spots form on the cathode surface as the electrodes are separated. These small, luminous regions are often very mobile and move rapidly over the cathode surface. Due to the high current density contained in each spot, rapid ebullition of the cathode material occurs, and this plasma material can be confined, transported using magnetic fields and deposited on substrates. The current density at each spot can reach 100,000 amperes per square centimeter and this contributes to the ionization of much of the outflowing vapor.

One of the major problems associated with cathodic arc discharges is the production of macroparticles. Macroparticles are droplets or solid particles of the consumable cathode which range in size from about 0.1 micron to greater than about 50 microns, most being between about 0.5 and 20 microns. These macro particles are deposited with the plasma to produce unwanted particles in the final coating. Macroparticle production is particularly undesirable for diamond-like carbon coatings because they are graphite and become embedded in the diamond-like carbon coating. Much attention has been given to the removal of these particles.

U.S. Pat. No. 4,452,686 (Axenov et at.) describes one means of macroparticle removal via filtration. A cylindrically shaped current coil and a central axially mounted, football-shaped coil produce a magnetic field that guides the plasma around the central coil and through the plasma guide system. Macroparticles, which are much heavier than the plasma particles are not guided by the magnetic field and, thus, are blocked by the central coil. Downstream, the plasma macroparticle density is significantly reduced.

I. I. Aksenov et at., "Transport of Plasma Streams in a Curvilinear Plasma Optics System", *Soviet Journal Physics,* 4(4), July–August 1978, pp. 425–428, describes a vacuum apparatus using curvilinear magnetic and electric fields to steer and focus the plasma and remove macroparticles from the plasma stream.

Although such filtration means do reduce the macroparticle density in the coatings, they do not completely remove all macroparticles. Typically, the larger macroparticles are filtered, but the submicron particles are not completely filtered. This can occur as the submicron particles bounce around in the vacuum system. This can also result from momentum transfer from the plasma to the particles. Furthermore, plasma filters typically reduce the plasma flux by 30 to 50 percent, leading to reduced deposition rates.

SUMMARY OF THE INVENTION

The present invention provides a method for producing a diamond-like carbon coating comprising the steps of providing a substrate to be coated, providing a cathode of vitreous carbon or pyrolytic graphite and initiating a cathodic arc discharge with the arc spot on the cathode surface and directing the resulting carbon plasma toward the substrate to form a coating on said substrate, said coating being substantially macroparticle free. The discharge may optionally be carried out in a magnetic field. The present invention overcomes the problem of macroparticles in diamond-like carbon coatings produced using a cathodic arc generator. The method of the present invention produces high quality, non-hydrogenated diamond-like coatings at high deposition rates.

The present invention utilizes the cathodic arc process to produce non-hydrogenated, non-crystalline, diamond-like carbon coatings and films which are essentially macroparticle free. Unlike the prior art where the removal or filtration of the macroparticles was of prime concern, the present invention utilizes a cathodic arc carbon cathode material which does not generate macroparticles in the plasma discharge.

DETAILED DESCRIPTION OF THE INVENTION

Figure 1:
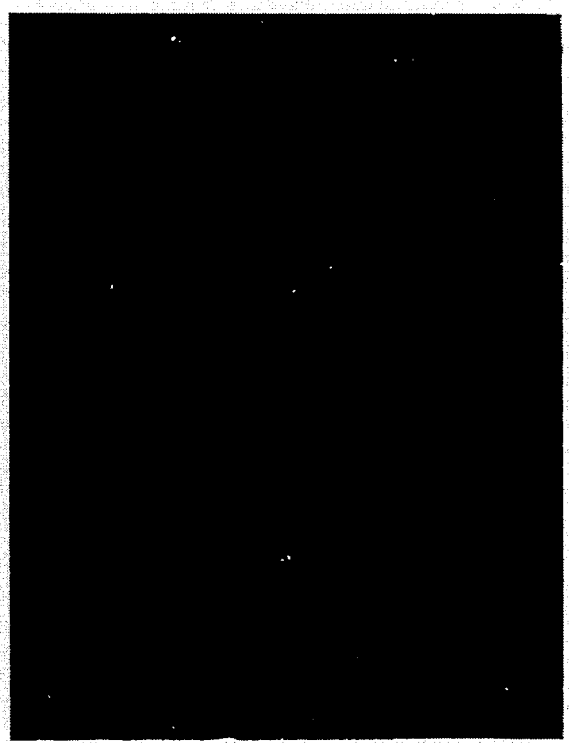
FIG. 1 is a photomicrograph of the coating of Example 3 at 106×.

The cathodic arc discharge coating process can be carried out under vacuum at pressues of, e.g., less than $10^{-3}$ Torr, at ambient conditions, e.g., room temperature of 20°-25° C., in an inert atmosphere such as, for example, argon, or in a reactive atmosphere such as hydrogen or oxygen. The preferred mode is without gas flowing into the chamber. A cooled substrate holder may be preferred to keep the substrate at room temperature of slightly below room temperature when large plasma fluxes are produced.

The cathode and, optionally, the anode can be electrically isolated from the vacuum chamber and electrically connected by a DC high current power source such as a welding power supply, i.e., continuous DC arc discharge. Alternatively, the arc discharge can be powered by a capacitor to produce a pulsed arc discharge.

The cathodic arc discharge can be ignited by various means such as, for example, a mechanical striker, thin film ablation, high voltage spark discharge or a focused laser beam.

The arc voltage is preferably between about 20 to 60 volts, more preferably between about 20 and 35 volts. The arc current is preferably greater than about 50 amps, more preferably greater than about 75 amps. The substrate surface temperature is preferably below about 200° C., and can be reduced by cooling.

The carbon coating produced by the method of the present invention preferably has a plasmon energy loss of at least about 26 eV, more preferably at least about 29 eV.

EXAMPLES

The cathodic arc apparatus used in the present invention was similar to that described in U.S. Pat. No. 3,836,451 (Snaper) which is incorporated herein by reference. A water-cooled copper block held the cathode. The cathode and anode were each electrically isolated from the vacuum chamber and connected to a DC welding power supply (INTELLIWELD 650, available from Miller Welding Co.) modified to produce an open circuit voltage of 95 V. The vacuum vessel was 0.4 m in diameter and 1 m long and pumping was by an oil diffusion pump. The base pressure was between about $1·10^{-6}$ and $5·10^{-6}$ Torr. No inert or reactive gas was flowing into the system during the arc discharge. The power supply was operated in a constant current mode at 100 amps arc current. The open circuit voltage for the power supply was about 95 volts. The geometry and B field strength produced an arc voltage of about 25 to 35 volts. The cathodic arc discharge was operated in an intermittent manner. The discharge was maintained at 100 amps for 5.5 seconds then, after a 5 second pause, the cathodic arc discharge was reignited.

The cathodic arc discharge was ignited by a mechanical striker. The striker was moved into momentary contact with both the cathode and anode and, as the striker was separated from the cathode surface, a plasma discharge was formed which moved outward from the cathode surface.

The plasma discharge was collected and transported by magnetic fields created by two electromagnetic coils, spaced approximately 35 cm apart. The electromagnetic coil nearest the cathode was operated with 10 amps while the coil nearer the sample was operated with 2 amps. This geometry created a stronger magnetic field inside the coils and a weaker field between the coils. Consequently, the plasma expanded between the coils. In addition to a cooled cylindrical copper anode near the cathode, a cylindrically shaped stainless steel screen was placed within and coaxial to the vacuum chamber. This allowed a lower arc voltage of about 25 to 35 volts to be maintained even when large magnetic fields were applied near the cathode. This geometry allowed electrons in the plasma to follow magnetic field lines to the anode i.e., to follow a low voltage path. This resulted in a more stable discharge.

The substrates used were undopeal 7.6 cm diameter silicon wafers. The wafers were held onto the face of a water-cooled sample holder with a 5 cm diameter face which was electrically isolated from ground. The wafers effectively hid the sample holder from the plasma flux. A bias voltage of $-15$ volts relative to the chamber was applied for each sample. Immediately prior to the cathodic arc discharge, the silicon wafer was sputtered clean with 1500 eV $Ar^+$ ions incident at about a 60° angle relative to the surface normal. A Kauffman type ion source (available from Commonwealth Scientific Co.) was used with argon gas flowing into the back of the ion source. The argon flow rate was sufficient to increase the system pressure to about $7·10^{-4}$ Torr while the diffusion pump continued to pump on the system. The sputter cleaning cycle lasted for about 5 to 5.5 minutes.

During the cathodic arc discharge the current to the sample and passing through the sample bias power supply was monitored since it is equal to the carbon ion current impinging on to the sample and sample holder. The thickness of the coating was controlled by integrating the carbon ion current to the sample. This was accomplished by transforming the carbon ion current into a voltage by measuring the voltage drop across a 4 ohm resistor.

The diamond-like carbon coatings of the following examples were examined for macroparticles using a NICON MEASURESCOPE, Model UM-2, optical microscope. Macroparticles were readily visible as bright spots on a dark background when imaged in a dark field mode. Photomicrographs were obtained at magnifications of 106× and 426×. Two methods were used to measure the macroparticle density from photographs of the deposited films.

An Advanced Image Analysis System was used to count the number of macroparticles in a region of the surface on the photomicrographs. The analysis area examined was 200 μm × 162 μm for the 426× photomicrographs and 804 μm × 651 μm for the 106× photomicrographs. Preferably, there are less than about 10 macroparticles in the 426× analysis area and less than about 100 macroparticles in the 106× analysis area, more preferably less than 50 macroparticles in the 106× analysis area.

Example 1-3

Figure 2:
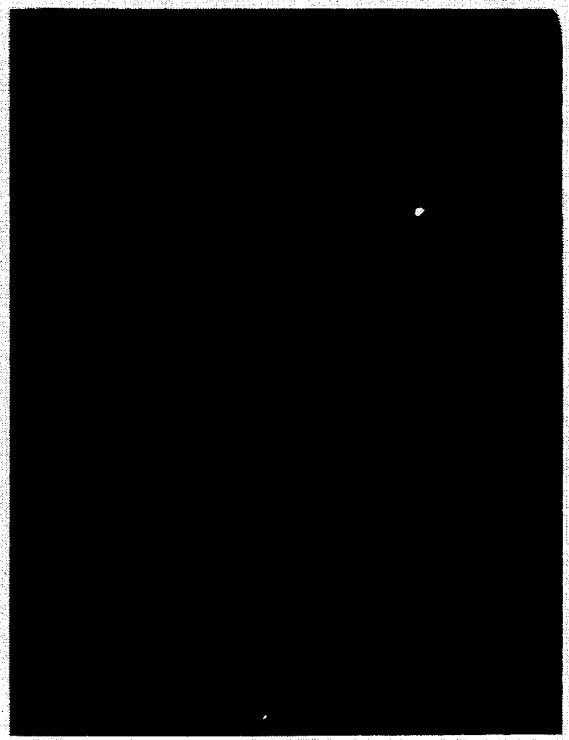
FIG. 2 is a photomicrograph of the coating of Example 3 at 426×.
Figure 5:
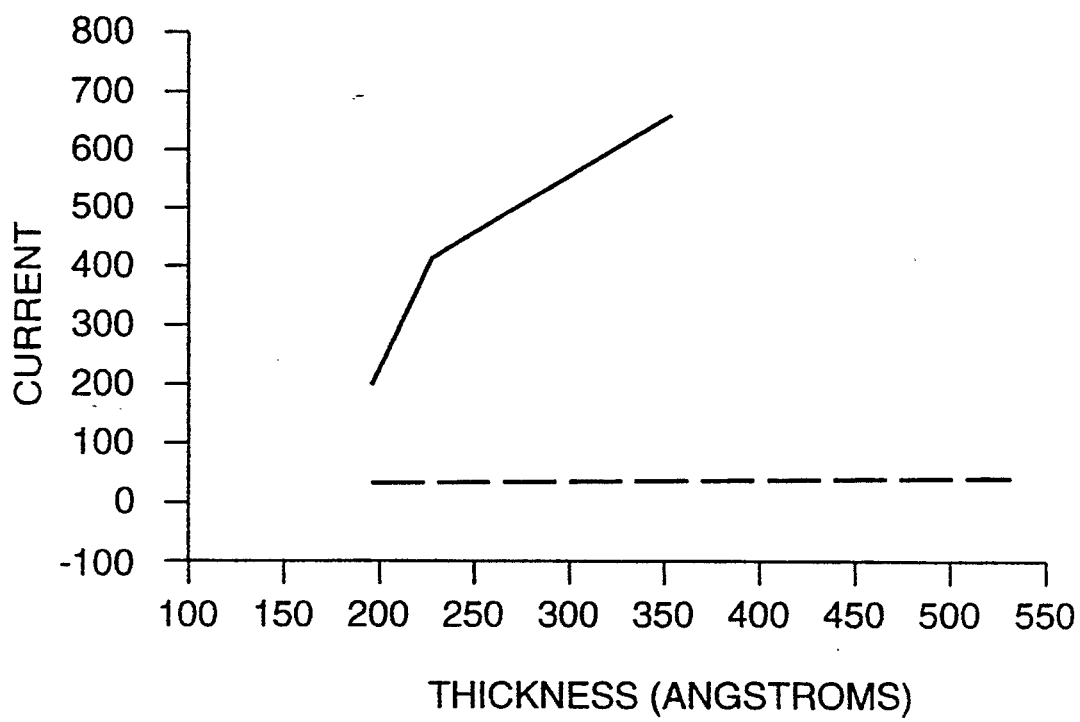
FIG. 5 is a graph showing the relation between macroparticle count and coating thickness at 106× for Examples 1-3 (dashed line) and Comparative Examples C1-C3 (solid line).
Figure 6:
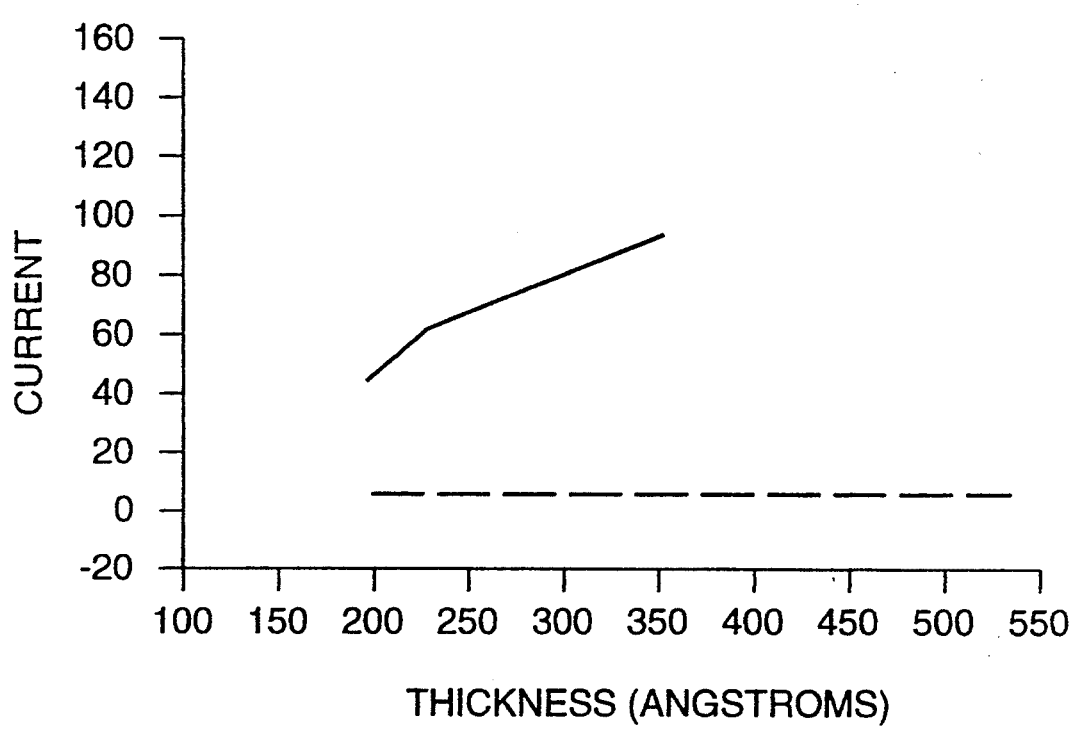
FIG. 6 is a graph showing the relation between macroparticle count and coating thickness at 426× for Examples 1-3 (dashed line) and Comparative Examples C1-C3 (solid line).

In each of Examples 1-3, an undoped 46 cm² silicon wafer, Si(100), was placed in the cathodic arc vacuum chamber, Ar$^+$ sputter cleaned, and exposed to the carbon plasma produced by a SIGRADUR G vitreous carbon cathode (available from Sigri Corporation, Somerville, N.J.) in the form of three 1.27 cm × 5.1 cm × 0.4 cm plates forming a 1.27 cm × 1.2 cm rectangular cross-sectional area to produce diamond-like coatings of various thicknesses as set forth in Table 1. Photomicrographs were taken. Photomicrographs of the 530 Å thick coating are shown in FIGS. 1 and 2. The macroparticle count was determined using the image analysis software. The macroparticle counts are shown in Table 1 and in FIGS. 5 and 6 (dashed lines). As can be seen, the macroparticle count is very low. The apparent macroparticles which are seen in the photomicrographs are believed to be due to debris, impurities in the system. The cathodic arc discharge is believed to be free of macroparticles.

The diamond-like carbon coatings of Examples 1-3 were shown to be hydrogen free by Attenuated Total Reflection (ATR) Infrared spectroscopy. This was determined by comparing cathodic arc produced coatings with RF deposited diamond-like carbon coatings. The latter were made using a parallel plate PLASMATHERM Model PK 2480 RF plasma reactor with butadiene as the reactant gas. The ATR signal for cathodic arc produced diamond-like coatings was compared with samples known to contain a significant hydrogen content. The latter samples were deposited directly on germanium ATR crystals and absorption measurements in the 2800 cm-1 to 3200 cm-1 were made in a DIGILAB Model FTS-50 spectrometer using a SPECTRATECH ATR cell. The RF plasma deposited hydrogen films displayed a broad absorption band due to the C-H stretching vibrations. The spectrum for the cathodic arc produced diamond-like carbon films of Examples 1-3 were devoid of C-H stretching vibrations. It therefore can be concluded that unlike the hydrogenated diamond-like carbon film deposited by the RF plasma process, the diamond-like carbon film of the invention deposited by cathodic arc evaporation from an amorphous vitreous carbon cathode is truly non-hydrogenated.

Standard Auger analysis of the films of Examples 1-3 indicated a carbon component of 97 percent or more with oxygen being the major trace impurity which was usually concentrated at the substrate/coating interface.

Electron Energy Loss Spectroscopy (EELS) was used to determine the plasmon energy loss of the coatings utilizing standard electron spectroscopic apparatus. The plasmon energy loss is related to the structural properties of the film because it is proportional to the valence electron density which is proportional to the atom density. Diamond has a plasmon energy loss of 33 eV and polycrystalline graphite about 25 eV. Rother et al., Journal of Material Research, vol. 6, no. 1, January 1991, pg 101, measured the plasmon energy of diamond-like carbon films with various deposition techniques and found that cathodic arc produced films have a higher fraction of diamond bonding character with a plasmon energy of between 29 and 30 eV. Rother et al. measured the plasmon energy of their films in the transmission mode which requires the film to be separated from the substrate and very high incident electron energies must be used. The plasmon energy of the films of the present invention were measured in the reflective mode with a beam energy of about 2000 eV wherein the film does not have to be separated from the substrate and the loss energy was found to be about 29 eV.

Comparative Examples C1-C3

Figure 3:
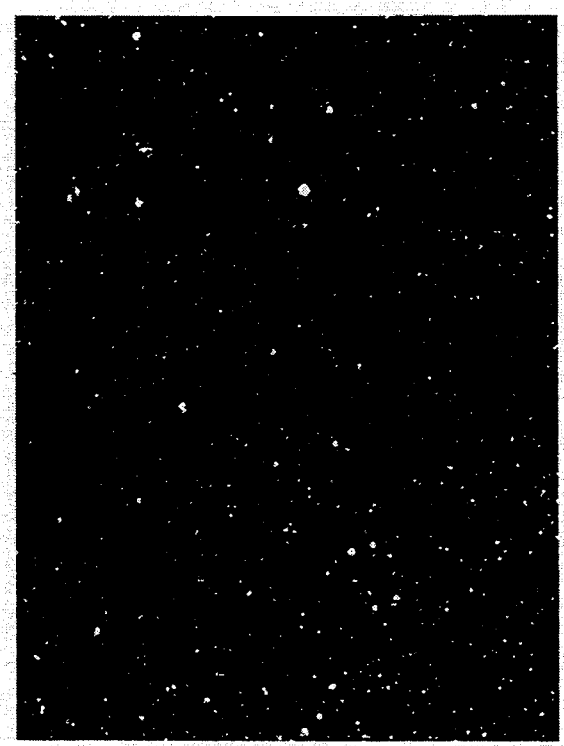
FIG. 3 is a photomicrograph of the coating of Comparative Example 3 at 106×.
Figure 4:
FIG. 4 is a photomicrograph of the coating of Comparative Example 3 at 426×.

In each of Comparative Examples C1-C3, a 46 cm² silicon wafer, Si(100), was placed in the cathodic arc vacuum chamber, sputter cleaned, and exposed to the cathodic arc carbon plasma produced from a 1.9 cm diameter POCO SFG-2 graphite carbon cathode (available from Poco Graphite, Inc. a Unocal Company, Decatur, Tex.) which is an ultra-fine grained and ultra pure material with 18 percent porosity to produce diamond-like coatings of various thicknesses as set forth in Table 1. Photomicrographs were taken. Photomicrographs of the 350 Å thick coating are shown in FIGS. 3 and 4. The macroparticle count was determined using the image analysis software. The macroparticle counts are shown in Table 1 and in FIGS. 5 and 6 (solid lines). As can be seen, these coatings have a high number of macroparticles and the number of macroparticles increases with increasing thickness.

TABLE 1

| Example | Thickness | Macroparticle Count 106X | 426X |
|---|---|---|---|
| 1 | 200Å | 34 | 4 |
| 2 | 490Å | 40 | 6 |
| 3 | 530Å | 46 | 4 |
| C1 | 200Å | 200 | 17 |
| C2 | 230Å | 412 | 50 |
| C3 | 350Å | 665 | 83 |

Example 4

In Example 4, a 46 cm² silicon wafer, Si(100), was placed in the cathodic arc vacuum chamber, sputter cleaned, and exposed to the plasma produced by a 1.9 cm diameter pyrolytic graphite carbon cathode from BF Goodrich which is an oriented large-grained polycrystalline carbon material to produce a diamond-like coating about 420 Å thick. The macroparticle count was determined by visually counting bright spots in a 426× Namarski photomicrograph and was found to be between about 30 and 50 for a 200 μm × 163 μm area.

Comparative Example C4

In Comparative Example C4, a 46 cm² silicon wafer, Si(100), was placed in the cathodic arc vacuum chamber, sputter cleaned, and exposed to the plasma produced by a 1.9 cm diameter carbon-carbon composite material of randomly oriented carbon fibers in a carbon matrix (available from BF Goodrich) to produce a diamond-like coating about 500 Å thick. The macroparticle count in three diamond-like carbon coatings was determined by counting bright spots in a 426× dark field photomicrograph and was found to be between 200 to 350 over a 200 µm×163 µm area.

The various modifications and alterations of this invention will be apparent to those skilled in the art without department from the scope and spirit of this invention and this invention should not be restricted to that set forth herein for illustrative purposes.

What is claimed is:

1. A method for producing a diamond-like carbon coating comprising the steps of providing a substrate to be coated, providing a cathode of vitreous carbon or a pyrolytic graphite cathode and initiating a substantially macroparticle free cathodic arc discharge with the arc spot on the cathode surface and directing the resulting carbon plasma toward the substrate to form said coating on said substrate, said coating being substantially macroparticle free.

2. The method of claim 1 wherein said cathodic arc discharge is powered by a DC power source.

3. The method of claim 1 wherein said cathodic arc discharge is powered by a capacitor to produce a pulsed arc discharge.

4. The method of claim 1 wherein the arc voltage is between about 20 to 60 volts.

5. The method of claim 1 wherein the arc current is at least about 50 amps.

6. The method of claim 1 wherein said discharge is carried out in a magnetic field.

7. The method of claim 1 wherein said coating has a plasmon energy loss of at least about 26 electron volts.

8. The method of claim 1 wherein said coating has less than 100 macroparticles in an area of 804 µm×651 µm at 106× magnification.

9. The method of claim 1 wherein said coating has less than 10 macroparticles in an area of 200 µm×162 µm at 426× magnification.

10. A method for producing a diamond-like carbon coating comprising the steps of providing a substrate to be coated, providing a cathode of vitreous carbon in a magnetic field and initiating a substantially macroparticle free cathodic arc discharge with the arc spot on the cathode surface and directing the resulting carbon plasma toward the substrate to form said coating on said substrate, said coating being substantially macroparticle free.

11. The method of claim 10 wherein said discharge is carried out in a magnetic field.

12. A method for producing a diamond-like carbon coating comprising the steps of providing a substrate to be coated, providing a pyrolytic graphite cathode and initiating a substantially macroparticle free cathodic arc discharge with the arc spot on the cathode surface and directing the resulting carbon plasma toward the substrate to form said coating on said substrate, said coating being substantially macroparticle free.

13. The method of claim 12 wherein said discharge is carried out in a magnetic field.

* * * * *

UNITED STATES PATENT AND TRADEMARK OFFICE
CERTIFICATE OF CORRECTION

PATENT NO. : 5,401,543
DATED : March 28, 1995
INVENTOR(S) : David G. O'Neill and Jonathan G. Storer It is certified that error appears in the above-indentified patent and that said Letters Patent is hereby corrected as shown below:

Col. 4, line 34          "undopeal" should read -- undoped --

Col. 4, lines 5, 6, 9,
10, Col. 5, line 14,
and Col. 6, line 48      "are" should read -- arc --

Signed and Sealed this

Eighth Day of August, 1995

*Attest:*

BRUCE LEHMAN

*Attesting Officer*            *Commissioner of Patents and Trademarks*